(12) United States Patent
Adams (10) Patent No.: US 10,361,143 B2
(45) Date of Patent: Jul. 23, 2019

(54) APPARATUS AND METHOD FOR RECONFIGURABLE THERMAL MANAGEMENT USING FLOW CONTROL OF LIQUID METAL

(71) Applicant: Raytheon Company, Waltham, MA (US)

(72) Inventor: Jason D. Adams, Medway, MA (US)

(73) Assignee: Raytheon Company, Waltham, MA (US)

( * ) Notice: Subject to any disclaimer, the term of this patent is extended or adjusted under 35 U.S.C. 154(b) by 232 days.

(21) Appl. No.: 15/611,138

(22) Filed: Jun. 1, 2017

(65) Prior Publication Data
US 2018/0352678 A1   Dec. 6, 2018

(51) Int. Cl.
| | |
|---|---|
| *H05K 7/20* | (2006.01) |
| *F28F 13/16* | (2006.01) |
| *H01L 23/473* | (2006.01) |
| *H05K 1/02* | (2006.01) |
| *H01L 23/367* | (2006.01) |

(52) U.S. Cl.
CPC ........ *H01L 23/473* (2013.01); *H01L 23/3677* (2013.01); *H05K 1/02* (2013.01)

(58) Field of Classification Search
CPC ............. H01L 2924/00; H01L 51/5072; H01L 23/473; H01L 27/3241; G09G 2300/08; G09G 2300/0809; H05K 1/0207; H05K 1/0212; H05K 1/0272; H05K 1/11; H05K 2201/041; H05K 7/02; H05K 7/20263; H05K 7/20281; H05K 7/205; F28D 20/021; F28D 20/023; F28F 13/003; G11C 19/28

See application file for complete search history.

(56) References Cited

U.S. PATENT DOCUMENTS

| | | | |
|---|---|---|---|
| 4,032,929 A * | 6/1977 | Fischbeck | B41J 2/14298 310/328 |
| 5,757,446 A | 5/1998 | Ovshinsky et al. | |
| 8,174,830 B2 | 5/2012 | Lower et al. | |

(Continued)

OTHER PUBLICATIONS

Khan et al., "Giant and Switchable Surface Activity of Liquid Metal via Surface Oxidation", Proceedings of the National Academy of Science, vol. 111, No. 39, Sep. 2014, 5 pages.

(Continued)

*Primary Examiner* — James Wu
*Assistant Examiner* — Michael A Matey (57) ABSTRACT

An apparatus includes a substrate and a matrix having multiple cells embedded within the substrate. The matrix is configured to generate electrostatic fields to define at least one flow path for liquid metal. The apparatus also includes a pump configured to create movement of the liquid metal through the at least one flow path defined by the matrix. The matrix is configured to transport the liquid metal through the at least one flow path in order to remove thermal energy from one or more areas of the substrate. The matrix could include a matrix of capacitors, and polarities of charges stored on the capacitors could define which cells allow passage of the liquid metal and which cells block or restrict passage of the liquid metal. The cells that block or restrict passage of the liquid metal could be configured to increase a viscosity of the liquid metal.

20 Claims, 4 Drawing Sheets

(56) References Cited

U.S. PATENT DOCUMENTS

| | | | | |
|---|---|---|---|---|
| 2002/0097962 A1* | 7/2002 | Yoshimura | ............... | G02B 6/10 385/50 |
| 2004/0246311 A1* | 12/2004 | Silverbrook | ......... | B41J 2/14314 347/57 |
| 2009/0145760 A1* | 6/2009 | Birang | ................... | C25D 15/02 204/509 |
| 2009/0279257 A1* | 11/2009 | Lower | ................... | H05K 1/0272 361/699 |
| 2010/0210067 A1* | 8/2010 | Butcher | ................ | C23C 16/303 438/99 |
| 2011/0192969 A1* | 8/2011 | Verentchikov | ........ | H01J 49/062 250/282 |
| 2016/0196997 A1* | 7/2016 | White | ............... | H01L 21/67718 361/234 |
| 2017/0150647 A1* | 5/2017 | Hyde | ................. | H05K 7/20254 |
| 2017/0183776 A1* | 6/2017 | Butcher | .................. | C30B 25/16 |
| 2017/0354969 A1* | 12/2017 | Lionberger | ............. | B03C 5/024 |

OTHER PUBLICATIONS

Dickey et al., "Researchers Control Surface Tension to Manipulate Liquid Metals", North Carolina State News, Sep. 2014, 4 pages.

* cited by examiner

APPARATUS AND METHOD FOR RECONFIGURABLE THERMAL MANAGEMENT USING FLOW CONTROL OF LIQUID METAL

TECHNICAL FIELD

This disclosure relates generally to thermal management of electronic components or other heat sources. More specifically, this disclosure relates to an apparatus and method for reconfigurable thermal management using flow control of liquid metal.

BACKGROUND

Electronic devices routinely include semiconductor devices and other circuit components that generate heat and that require cooling during operation of the electronic devices. For example, a large number of semiconductor devices could be used to process data, process radio frequency (RF) signals, or generate direct current (DC) power in data centers, radar systems, wireless base stations, or other systems. A common trend is to include more and more circuit components within a smaller space, which raises problems for effective thermal management of the circuit components.

In some conventional approaches, a heat source (such as an integrated circuit chip) is placed over one or more layers of copper, and the heat source is coupled to the copper layers by thermal or electrical vias. Heat can be transferred from the source to the copper layers through the vias, and the copper layers can transport the heat to the edges or bottom of an assembly. If needed, a cold plate having copper or other tubes for transporting coolant could be used to remove the heat from the edges or bottom of the assembly.

SUMMARY

This disclosure provides an apparatus and method for reconfigurable thermal management using flow control of liquid metal.

In a first embodiment, an apparatus includes a substrate and a matrix having multiple cells embedded within the substrate. The matrix is configured to generate electrostatic fields to define at least one flow path for liquid metal. The apparatus also includes a pump configured to create movement of the liquid metal through the at least one flow path defined by the matrix. The matrix is configured to transport the liquid metal through the at least one flow path in order to remove thermal energy from one or more areas of the substrate.

In a second embodiment, a system includes multiple circuit cards. At least one of the circuit cards includes a substrate and a matrix having multiple cells embedded within the substrate. The matrix is configured to generate electrostatic fields to define at least one flow path for liquid metal. The system also includes at least one pump configured to create movement of the liquid metal through the at least one flow path defined by the matrix of the at least one circuit card. The matrix of the at least one circuit card is configured to transport the liquid metal through the at least one flow path in order to remove thermal energy from one or more areas of the substrate of the at least one circuit card.

In a third embodiment, a method includes configuring a matrix having multiple cells embedded within a substrate to generate electrostatic fields in order to define at least one flow path through the substrate. The method also includes pumping liquid metal through the at least one flow path defined by the matrix and removing thermal energy from one or more areas of the substrate using the liquid metal.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

FIGS. 1 through 5, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, electronic devices routinely include circuit components that generate heat and that require cooling during operation of the electronic devices. The trend of including more and more circuit components within a smaller space means that electronic devices are exhibiting higher and higher power dissipation densities, which raises problems for effective thermal management of the circuit components. For example, components of radio frequency (RF) cards, power circuit cards, and other circuit cards often require a low thermal resistance pathway to a cold plate, a cooling edge, or another cooling structure. While copper layers and cold plates can be effective in some circumstances, they may not be effective in other circumstances, particularly when the power dissipation density is very high. Among other reasons, this is because copper layers and cold plates are static structures within electronic devices, meaning they can only provide cooling to fixed locations where the copper layers and cold plates are formed or placed. Copper layers and cold plates are not designed to provide dynamic cooling to different components of a structure.

This disclosure provides techniques supporting reconfigurable thermal management using flow control of liquid metal. In accordance with this disclosure, an electronic device includes a substrate having an embedded matrix that forms an electrostatic grid. The electrostatic grid is used to dynamically define one or more flow paths for liquid metal through the substrate. The liquid metal can be used to remove heat from various heat-generating structures, and the flow path(s) for the liquid metal can be created and adjusted dynamically. The liquid metal could be pumped through the flow path(s) using one or more electromagnetic pumps.

These techniques can provide a number of advantages depending on the implementation. For example, a high rate of thermal transfer can be achieved due to the liquid metal's high thermal conductivity. The liquid metal can therefore be used to more easily or effectively transport heat out of a substrate to other components for dissipation or transfer. Moreover, the flow paths for the liquid metal can be altered depending on changing thermal management needs. This allows more efficient or optimal thermal management paths to be defined dynamically, which helps to increase or optimize thermal transfer to occur. In addition, electromagnetic pumps are non-mechanical pumps and therefore less prone to mechanical failures, and using electromagnetic pumps can remove the necessity for bulky and power-hungry mechanical pumps.

Figure 1:
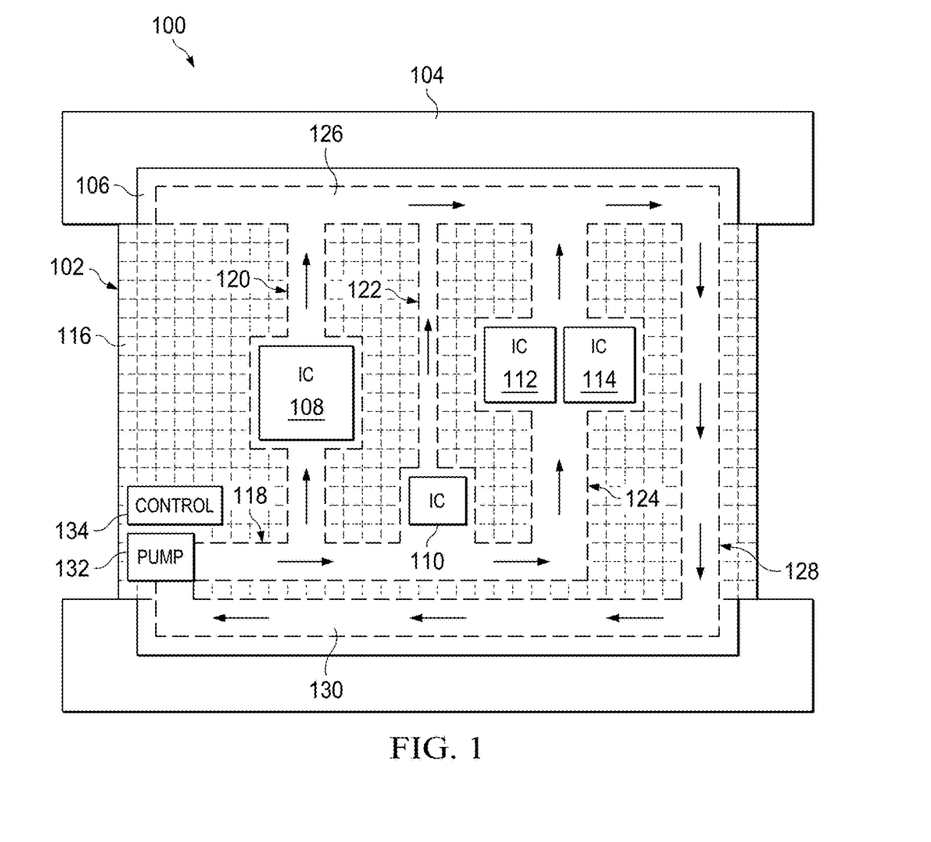
FIG. 1 illustrates an example apparatus supporting reconfigurable thermal management using flow control of liquid metal according to this disclosure.

FIG. 1 illustrates an example apparatus 100 supporting reconfigurable thermal management using flow control of liquid metal according to this disclosure. As shown in FIG. 1, the apparatus 100 includes a substrate 102 on or in which circuit components are formed or placed. The circuit components could be used to provide any desired functionality for the apparatus 100. The substrate 102 denotes any suitable structure that could be used to carry circuit components. In some embodiments, the substrate 102 denotes a printed circuit board (PCB), such as a single-sided, double-sided, or multi-layer printed circuit board. The substrate 102 could also be formed from any suitable material(s), such as rigid or flexible plastic, fiberglass, or epoxy.

The substrate 102 here is mounted in a chassis 104. The chassis 104 denotes any suitable structure configured to receive and retain one or more substrates 102. For example, the chassis 104 could denote a metal structure or other structure having a high thermal conductivity. Note that, in this example, the substrate 102 is not rectangular but includes portions that project outward on top and bottom in FIG. 1 for insertion into the chassis 104. This is for illustration only, and other embodiments of the substrate 102 and the chassis 104 could be used. For instance, the substrate 102 could be rectangular, and the chassis 104 could be configured to receive the substrate 102 along its entire length.

The substrate 102 in this example includes edge rails 106, which are located along at least the portions of the substrate 102 that contact the chassis 104. The edge rails 106 denote thermally-conductive structures configured to promote the transfer of thermal energy from the substrate 102 to the chassis 104. The edge rails 106 include any suitable structures for promoting thermal energy transfer, such as copper or other metal plating.

The circuit components carried by the substrate 102 in this example include multiple integrated circuit (IC) chips 108-114. The integrated circuit chips 108-114 generally denote semiconductor devices that could perform any of a wide variety of functions. Example functions could include data processing, RF signal processing, and direct current (DC) power generation. As a particular example, one or more of the integrated circuit chips 108-114 could form part of a Monolithic Microwave Integrated Circuit (MMIC). Of course, any other or additional functionality could be supported by the circuit components on the substrate 102.

Note that the number, sizes, and arrangement of the integrated circuit chips 108-114 in FIG. 1 are for illustration only. A substrate 102 could generally carry any suitable number(s) and type(s) of integrated circuit chips. Also note that numerous other or additional types of circuit components could be used for performing one or more desired functions instead of or in addition to the integrated circuit chips 108-114. In general, the substrate 102 could carry any suitable circuit components, at least some of which generate heat and are cooled.

To support dynamic thermal management of circuit components carried by the substrate 102, a matrix 116 forming an electrostatic grid is embedded within the substrate 102. As described in more detail below, the matrix 116 includes multiple cells (such as those arranged in rows and columns), and the cells are used to control the flow of a liquid metal through the matrix 116. For example, the cells in the matrix 116 could be formed using capacitors or other structures that generate electrostatic fields, and these fields can be used to control the viscosity of the liquid metal. As a particular example, the electrostatic fields can be used to selectively attract surface oxides in the liquid metal at certain locations, which reduces the liquid metal's viscosity at those locations and causes the liquid metal to flow through other locations. By proper configuration and reconfiguration of the cells in the matrix 116, different flow paths for the liquid metal could be defined through the matrix 116.

In this example, the matrix 116 has been configured to define a flow path 118 that receives incoming liquid metal and three flow paths 120-124 that branch off from the flow path 118. The three flow paths 120-124 join a flow path 126, which defines a path along at least part of the upper edge rail 106. The matrix 116 has also been configured to define a flow path 128, which links the flow path 126 to a flow path 130. The flow path 130 defines a path along at least part of the lower edge rail 106.

In the specific example shown in FIG. 1, the flow paths 118-130 allow liquid metal to flow through all of the integrated circuit chips 108-114 simultaneously. However, the flow paths defined by the matrix 116 could be dynamically altered as needed or desired. For example, one or more flow paths could be widened and/or one or more flow paths could be narrowed to alter the amounts of liquid metal removing heat from different circuit components. As another example, one or more flow paths could be added and/or one or more flow paths could be removed to redirect liquid metal to a different circuit component or a different combination of circuit components.

Note that one or more of the flow paths in the matrix 116 shown in FIG. 1 need not be reconfigurable and could be fixed. For example, at least a portion of one or more of the flow paths 118, 126-130 could be permanently defined in the matrix 116 so as to define input and/or output paths for the liquid metal. In that case, the flow paths 120-124 could be controlled dynamically to provide variable amounts of liquid metal for cooling the different integrated circuit chips 108-114. As another example, at least a portion of one or more of the flow paths 120-124 could be permanently defined in the matrix 116 so that liquid metal is constantly provided for cooling some of the integrated circuit chips 108-114. In this case, one or more of the other flow paths 120-124 could be controlled dynamically to provide variable amounts of liquid metal for cooling others of the integrated circuit chips 108-114.

In general, the matrix 116 can be configured in any number of ways to support any suitable flow path or paths of liquid metal through the matrix 116. The matrix 116 could include any number of fixed flow paths (including zero fixed flow paths) through the matrix 116, and the matrix 116 could be configured to define one or more controllable flow paths through the matrix 116. The configuration and reconfiguration of the matrix 116 can vary widely depending on a number of factors, such as the application in which the matrix 116 is used.

At least one pump 132 is used to force the liquid metal to flow through the defined flow path(s) in the matrix 116. The pump 132 denotes any suitable structure configured to move a liquid metal through one or more flow paths. The pump 132 could, for example, denote an electromagnetic pump that creates movement of the liquid metal using an electromagnetic field. For instance, the pump 132 could generate one or more magnetic fields, such as at an angle of about 90° to the desired flow direction. Since the fluid traveling through the pump 132 is liquid metal, the magnetic fields force the liquid metal to move in the desired direction. Note, however, that any other suitable type(s) of pump(s) could be used here.

At least one controller 134 is used to control the configuration of the matrix 116. For example, the controller 134 could be electrically coupled to each cell of the matrix 116 and could control the capacitors or other structures that generate electrostatic fields in the matrix 116. This allows the controller 134 to control the flow path(s) for the liquid metal through the matrix 116. For example, as noted above, the electrostatic fields could be configured so that surface oxides in the liquid metal are attracted at selective locations in order to reduce the viscosity of the liquid metal at those locations. This can be used to force the liquid metal to flow through other desired locations. Each controller 134 includes any suitable structure for controlling a matrix of cells, such as one or more processing devices. The processing devices could include one or more microprocessors, microcontrollers, field programmable gate arrays, application specific integrated circuits, or discrete logic devices. In some embodiments, the processing devices could execute software or firmware instructions stored in a memory to provide the desired control functionality.

Any suitable liquid metal could be used in FIG. 1 to remove heat from circuit components in or on the substrate 102. Examples of liquid metals that could be used in FIG. 1 include alloys containing gallium, indium, tin, bismuth, lead, sodium, potassium, or a combination therefore. As specific examples, the liquid metal could include liquid gallium or a liquid gallium alloy, such as eutectic gallium indium (EGaIn).

Although FIG. 1 illustrates one example of an apparatus 100 supporting reconfigurable thermal management using flow control of liquid metal, various changes may be made to FIG. 1. For example, the apparatus 100 could include any number of each component shown in FIG. 1. As a particular example, the matrix 116 could be divided into multiple matrices, a common pump 132 or separate pumps 132 could be used with the matrices, and a common controller 134 or separate controllers 134 could control the matrices. Also, the technique shown in FIG. 1 could be used for thermal management of any suitable components on at least one substrate and is not limited to use with just multiple integrated circuit chips. In addition, the apparatus 100 could be integrated into a larger circuit card assembly (CCA) or other structure that includes a number of additional circuit components, which may or may not be mounted to the same substrate 102 as the other components in FIG. 1.

Figure 2:
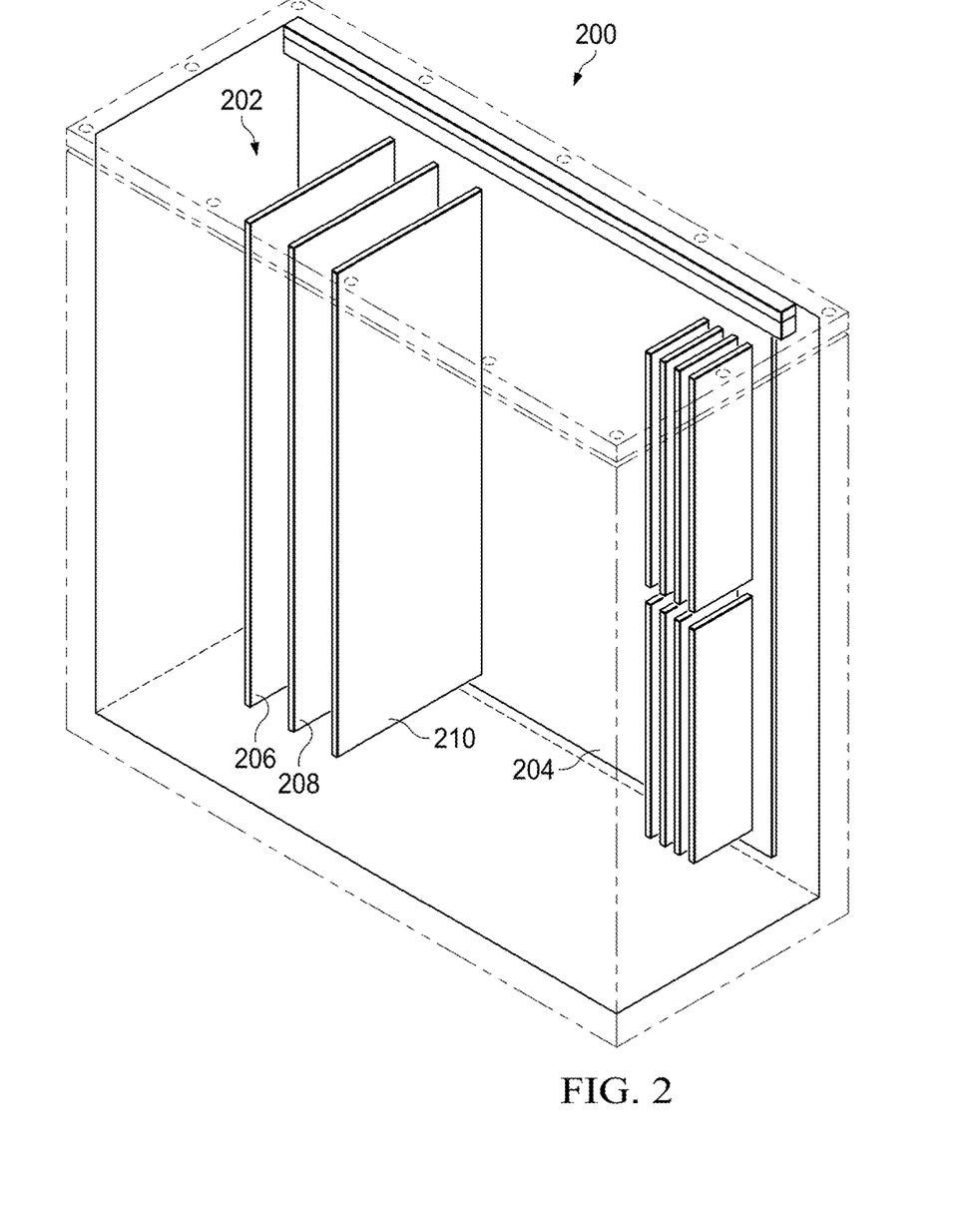
FIG. 2 illustrates an example system supporting reconfigurable thermal management using flow control of liquid metal according to this disclosure.

FIG. 2 illustrates an example system 200 supporting reconfigurable thermal management using flow control of liquid metal according to this disclosure. For ease of explanation, the system 200 of FIG. 2 is described an including one or more instances of the apparatus 100 of FIG. 1. However, the apparatus 100 could be used in any other suitable manner.

As shown in FIG. 2, the system 200 includes a case 202 in which a motherboard 204 and multiple child cards 206-210 are mounted. The case 202 generally includes any suitable structure configured to receive and retain multiple circuit cards and related components, such as a power supply and one or more fans. The motherboard 204 generally includes one or more processors, one or more memories, one or more interfaces, or other components used to support data processing or communications. Each of the child cards 206-210 generally includes other components used to provide additional functions in the system 200.

The system 200 shown here includes a single motherboard 204 and three child cards 206-210, which is for ease of illustration and explanation only. The system 200 could include any number of motherboards, and each motherboard could include any number of child cards. When a high-density computing or processing architecture is used, thermal management can be a particular concern since all of the circuitry on the various circuit cards in such an architecture can generate a large amount of heat.

To help provide thermal management in a high-density computing or processing architecture such as this, one or more of the circuit cards shown in FIG. 2 could incorporate the thermal management technique shown in FIG. 1. For example, at least one of the motherboard 204 or the child cards 206-210 could include a reconfigurable matrix 116, and the pump 132 and the controller 134 could be used to allow liquid metal to be pumped through the circuit card and cool one or more circuit components of the circuit card. The heat collected by the liquid metal in a circuit card of FIG. 2 could be passed into the case 202, radiated into the air within or outside the case 202, or otherwise transferred out of the system 200.

Note that when multiple circuit card assemblies or other circuit cards are used in a larger system, multiple circuit cards could each have its own pump 132 and controller 134, or multiple circuit cards could share one or more pumps 132 and/or one or more controllers 134. This could allow, for example, the pump(s) 132 and the controller(s) 134 to control the amount of liquid metal provided to different circuit cards as well as to different portions of the circuit cards. Among other things, this could allow a system 200 to provide liquid metal to cool a subset of the circuit cards in the system 200 and then to increase or decrease the number of circuit cards being cooled using the liquid metal as processing, communication, or other requirements on the system 200 change over time.

This sort of approach could find use in a large number of systems where a variable number of circuit cards may be needed over time. As a particular example, servers or other computing devices or components in a data center could come online and go offline or into standby as the amount of processing tasks varies over time. As another particular example, the number of processors or other components of a radar system could vary over time, such as based on the mode in which the radar system is operating. In these or other example systems, liquid metal could be used to cool different numbers of circuit cards over time, depending on the processing loads, operational modes, or other characteristics of the system 200.

Although FIG. 2 illustrates one example of a system 200 supporting reconfigurable thermal management using flow control of liquid metal, various changes may be made to FIG. 2. For example, the system 200 could include any number and arrangement of circuit cards, and any number of those circuit cards could include a reconfigurable matrix used for liquid metal transport. Also, the thermal management technique illustrated in FIG. 1 could be used in any other suitable system and is not limited to use in the specific example environment shown in FIG. 2.

Figure 3:
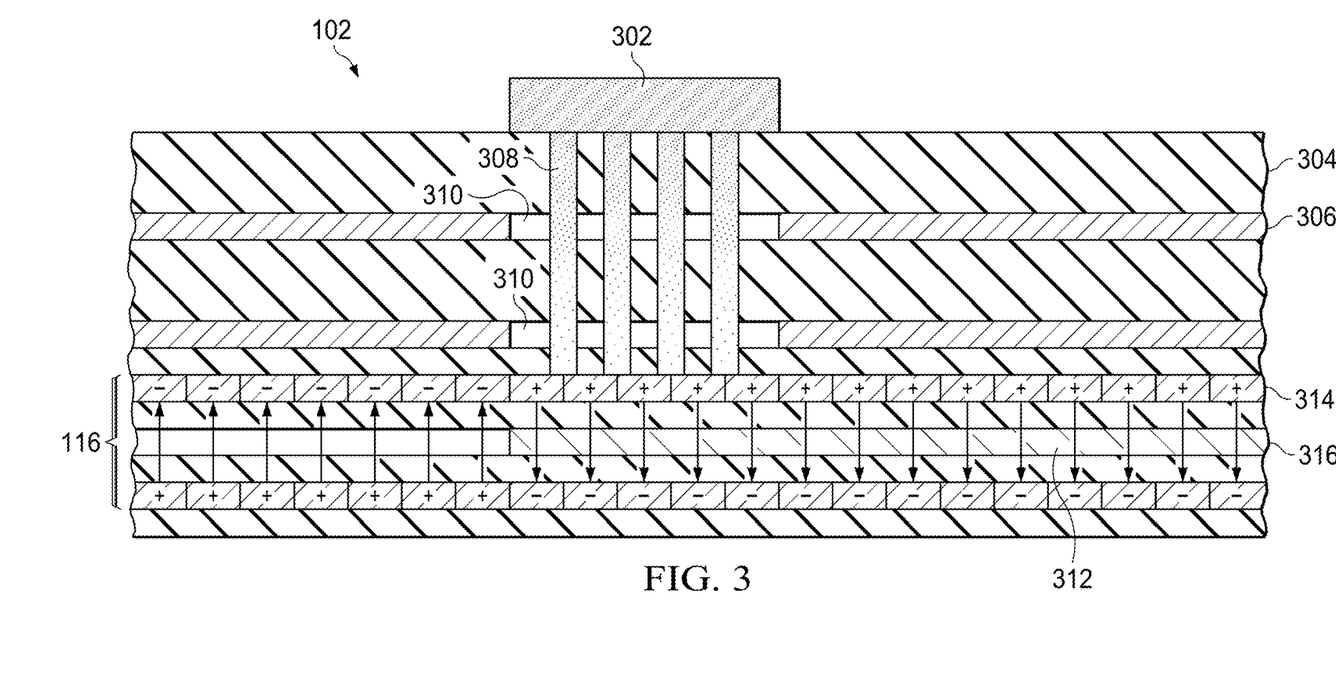
FIG. 3 illustrates an example matrix for reconfigurable thermal management using flow control of liquid metal according to this disclosure.

FIG. 3 illustrates an example matrix 116 for reconfigurable thermal management using flow control of liquid metal according to this disclosure. For ease of explanation, the matrix 116 of FIG. 3 is described as being used in the apparatus 100 of FIG. 1. However, the matrix 116 of FIG. 3 could be used in any other suitable device or system, and the apparatus 100 of FIG. 1 could include any other suitable configurable matrix.

As shown in FIG. 3, a heat-generating source 302 (such as one of the integrated circuit chips 108-114 of FIG. 1) is disposed on the substrate 102. The substrate 102 in this example is a multi-layer substrate containing multiple dielectric layers 304 and multiple thermally-conductive or electrically-conductive layers 306. Each of the dielectric layers 304 could be formed from any suitable dielectric material(s), and each of the conductive layers 306 could be formed from any suitable thermally or electrically conductive material(s). In particular embodiments, the conductive layers 306 could denote copper or other thermally-conductive layers used to transport heat away from other circuit components that are not shown in FIG. 3. Note, however, that the use of this specific multi-layer substrate is not required and that other multi-layer substrates or single-layer substrates could also be used.

In this example, the heat-generating source 302 is coupled to multiple thermal vias 308, which extend downward through openings 310 in the conductive layers 306 to the matrix 116. The thermal vias 308 denote structures formed of copper or other thermally-conductive material(s) that can transport thermal energy away from the heat-generating source 302 toward the matrix 116. The openings 310 in the conductive layers 306 allow the thermal vias 308 to pass through the conductive layers 306 without contacting the thermally-conductive material(s) of the conductive layers 306.

The thermal vias 308 extend downward to the matrix 116, which is embedded within the substrate 102. The matrix 116 is used to control the flow of a liquid metal 312 under the heat-generating source 302. In this example, the matrix 116 includes a number of capacitors 314, which form the cells of the matrix 116. Each capacitor 314 can be charged or discharged, such as based on signals from the controller 134.

The polarities of the charges stored on the capacitors 314 can define a flow path 316 through the matrix 116. This is because the polarities of the capacitors 314 can affect the viscosity of the liquid metal 312, such as by selectively attracting surface oxides in the liquid metal 312 only at specific locations to reduce the liquid metal's viscosity at those locations. In this example, the capacitors 314 on the right are charged so that their electric fields are opposite to the electric fields of the capacitors 314 on the left. The capacitor polarities on the right define cells that are "on," so these cells allow the liquid metal 312 to flow through those cells. In contrast, the capacitor polarities on the left define cells that are "off," so these cells block or restrict the liquid metal 312 from flowing through those cells by reducing the liquid metal's viscosity. By controlling which cells are "on" and "off," the controller 134 can control the creation of flow paths through the matrix 116. The capacitors 314 could be coupled to the controller 134 in any suitable manner, such as via a collection of thin film transistors that can selectively couple each capacitor 314 to a power source.

In this way, the capacitors 314 can be charged appropriately to define a first flow path or a first set of flow paths through the matrix 116. If a change is needed, the charges on at least some of the capacitors 314 can be changed, such as by reversing the charges on those capacitors 314, to define a second flow path or a second set of flow paths through the matrix 116. The first and second sets of flow paths could be completely different, or they could share one or more common flow paths. As a result, more effective thermal management could occur using the matrix 116.

The structure shown in FIG. 3 could be manufactured in any suitable manner. For example, manufacturing techniques typically used to fabricate liquid crystal displays could be adapted to form the capacitors 314 in a dielectric layer (since liquid crystal displays often include thin film transistors used to control the charging and discharging of capacitor arrays). Also, various techniques are known in the art for forming multi-layer substrates, forming openings through layers of a multi-layer substrate, and forming thermal vias.

Although FIG. 3 illustrates one example of a matrix 116 for reconfigurable thermal management using flow control of liquid metal, various changes may be made to FIG. 3. For example, the matrix 116 could be fabricated using any other suitable components that can generate electrostatic fields. Also, the charge polarities for the "on" and "off" cells in FIG. 3 are for illustration only.

Figure 4:
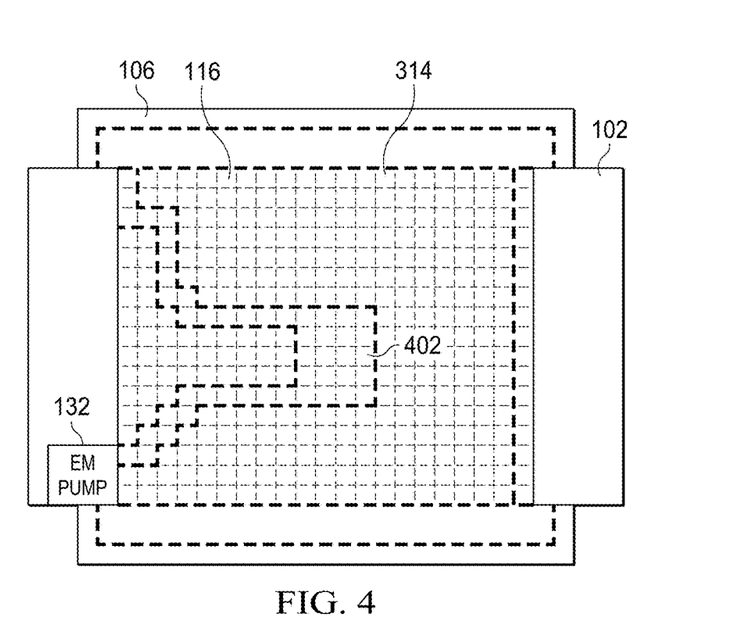
FIG. 4 illustrates an example configuration of a matrix providing reconfigurable thermal management using flow control of liquid metal according to this disclosure.

FIG. 4 illustrates an example configuration of a matrix 116 providing reconfigurable thermal management using flow control of liquid metal according to this disclosure. For ease of explanation, the configuration of FIG. 4 is described with respect to the matrix 116 of FIG. 3 in the apparatus 100 of FIG. 1. However, the matrix 116 and apparatus 100 could be configured in any other suitable manner.

As shown in FIG. 4, the matrix 116 is divided into rows and columns of cells, which can be defined by the various capacitors 314 embedded within the substrate 102. Similar to FIG. 1, there are flow paths defined along the top and bottom edges of the substrate 102, which may or may not be reconfigurable. The capacitors 314 are configured here to define a single flow path, which could be used to cool one or more circuit components in a given area 402. Liquid metal travels from the pump 132 to this area 402 and then returns to the pump 402 along the top, right, and bottom of the structure in FIG. 4.

As noted above, the horizontal portions of the flow path along the top and bottom of FIG. 4 could align with or be near the edge rails 106, allowing thermal energy carried by the liquid metal to be transferred to one or both of the edge rails 106. The fixed location of the edge rails 106 with respect to the matrix 116 is one reason why the horizontal portions of the flow path along the top and bottom of FIG. 4 may be fixed and not be reconfigurable. However, this need not be the case, and these portions of the flow path could be reconfigurable.

The arrangement of the matrix 116 and the edge rails 106 in FIG. 4 may allow the liquid metal to be at least partially cooled without requiring complete travel through a cooling loop. For example, the liquid metal could be at least partially cooled by the upper edge rail 106, so the liquid metal could then be provided to another area of the matrix 116 for cooling one or more additional circuit components on the substrate 102.

Although FIG. 4 illustrates one example of a configuration of a matrix 116 providing reconfigurable thermal management using flow control of liquid metal, various changes may be made to FIG. 4. For example, as noted above, the matrix 116 can support a wide variety of fluid paths through the substrate 102, and FIG. 4 does not confine the matrix 116 to any particular configuration.

Figure 5:
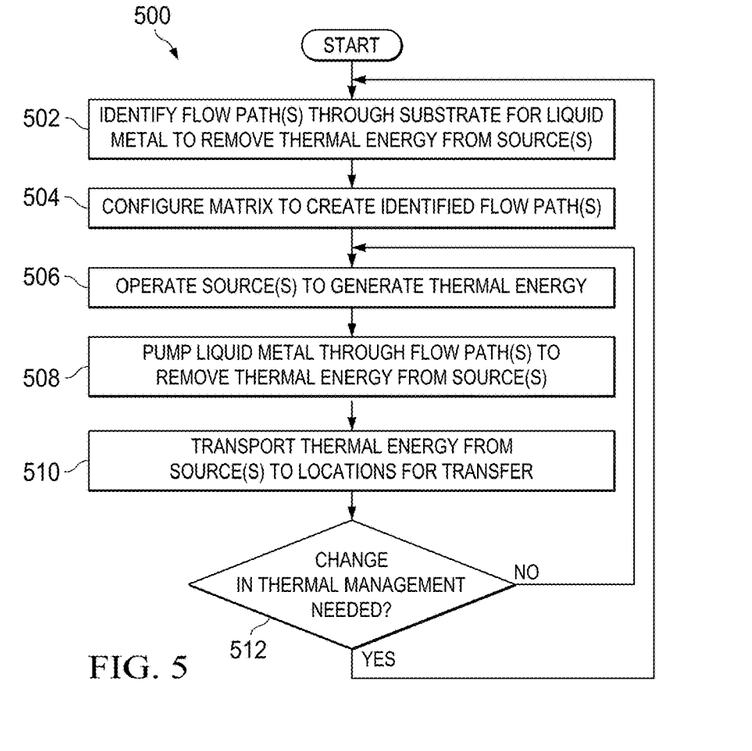
FIG. 5 illustrates an example method for reconfigurable thermal management using flow control of liquid metal according to this disclosure.

FIG. 5 illustrates an example method 500 for reconfigurable thermal management using flow control of liquid metal according to this disclosure. For ease of explanation, the method 500 of FIG. 5 is described with respect to the matrix 116 of FIG. 3 in the apparatus 100 of FIG. 1. However, the method 500 could be used with any other suitable matrix or device.

As shown in FIG. 5, one or more flow paths for liquid metal through a substrate are identified at step 502. This could include, for example, the controller 134 identifying one or more flow paths to be formed through the matrix 116 to provide desired cooling to one or more heat sources. The one or more flow paths could be identified in any suitable manner. For instance, different flow paths could be predefined based on different processing loads, operational modes, power requirements, or other requirements associated with the circuit components on the substrate 102. These predefined flow paths could be stored in a look-up table or other data structure accessible by the controller 134. The controller 134 could then use a current or desired processing load, operational mode, power requirement, or other requirement to select a predefined set of flow paths. As another example, the apparatus could include a number of temperature sensors that measure temperatures at different locations of the substrate 102 or at different circuit components in real-time. The controller 134 could then use the temperature measurements to identify the flow path(s), such as by identifying flow paths for cooling areas that are too hot.

A matrix is configured to create the identified flow path(s) through the substrate at step 504. This could include, for example, the controller 134 controlling various transistors or other structures to couple the capacitors 314 to a power supply or other voltage source. This could also include charging the capacitors 314 in a specified manner to create desired electrostatic fields in the matrix 116. As a particular example, this could include charging selected capacitors 314 along the desired flow path(s) to have an "on" state and charging other capacitors 314 to have an "off" state.

The one or more heat sources are operated to generate thermal energy at step 506. This could include, for example, the apparatus 100 operating the integrated circuit chips 108-114 to perform desired functions, which generates thermal energy.

Liquid metal is pumped through the one or more flow paths to remove thermal energy from the heat source(s) at step 508. This could include, for example, the pump 132 generating one or more magnetic fields that force the liquid metal 312 through the pump 132, thereby creating movement of the liquid metal 312 through the identified flow path(s). As part of this process, the "on" cells of the matrix 116 may allow the liquid metal 312 to pass through those cells, while the "off" cells of the matrix 116 may attract surface oxides of the liquid metal 312 and thereby increase the viscosity of the liquid metal 312 at or around those cells.

The thermal energy is transported by the liquid metal to one or more locations for transfer at step 510. This could include, for example, the liquid metal 312 transporting the thermal energy through the identified flow path(s) to one or more of the edge rails 106. The thermal energy from the liquid metal 312 could pass into the edge rails 106 and then to another structure or out into an ambient environment.

The generation and removal of thermal energy could continue in this manner until a change in thermal management is identified at step 512. This could include, for example, the controller 134 identifying a change in the processing load, operational mode, power requirement, or other requirement associated with the circuit components on the substrate 102. This could also include the controller 134 identifying portions of the apparatus 100 where the temperature measurements are increasing or above a threshold. At that point, the method 500 can return to step 502 to identify a different flow path or a different set of flow paths through the matrix 116. In this way, the flow paths for the liquid metal 312 through the substrate 102 can be dynamically modified to account for changing thermal management needs.

Although FIG. 5 illustrates one example of a method 500 for reconfigurable thermal management using flow control of liquid metal, various changes may be made to FIG. 5. For example, while shown as a series of steps, various steps in FIG. 5 could overlap, occur in parallel, occur in a different order, or occur any number of times. Also, while specific techniques have been described for identifying flow paths through a substrate, any other suitable techniques could be used here.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in this patent document should not be read as implying that any particular element, step, or function is an essential or critical element that must be included in the claim scope. Also, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," "processing device," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   a substrate;
   a matrix comprising multiple cells embedded within the substrate, the matrix configured to generate electrostatic fields to define at least one flow path for liquid metal; and
   a pump configured to create movement of the liquid metal through the at least one flow path defined by the matrix;
   wherein the matrix is configured to transport the liquid metal through the at least one flow path in order to remove thermal energy from one or more areas of the substrate; and
   wherein the cells of the matrix comprise capacitors.

2. The apparatus of claim 1, wherein polarities of charges stored on the capacitors define which cells allow passage of the liquid metal and which cells block or restrict passage of the liquid metal.

3. The apparatus of claim 2, wherein the cells that block or restrict passage of the liquid metal are configured to increase a viscosity of the liquid metal.

4. The apparatus of claim 1, wherein the pump comprises an electromagnetic pump.

5. The apparatus of claim 1, further comprising:
   a controller configured to adjust the matrix to define the at least one flow path for the liquid metal.

6. The apparatus of claim 5, wherein the controller is configured to adjust the matrix to define different flow paths or different combinations of flow paths for the liquid metal, the different flow paths or different combinations of flow paths configured to allow transport of the liquid metal to different areas of the substrate.

7. The apparatus of claim 1, further comprising:
   at least one flow path that is fixed and not reconfigurable.

8. The apparatus of claim 7, wherein:
   the substrate comprises at least one edge rail; and
   the at least one fixed flow path travels along the at least one edge rail.

9. A system comprising:
   multiple circuit cards, at least one of the circuit cards comprising:
      a substrate; and
      a matrix comprising multiple cells embedded within the substrate, the matrix configured to generate electrostatic fields to define at least one flow path for liquid metal; and
   at least one pump configured to create movement of the liquid metal through the at least one flow path defined by the matrix of the at least one circuit card;
   wherein the matrix of the at least one circuit card is configured to transport the liquid metal through the at least one flow path in order to remove thermal energy from one or more areas of the substrate of the at least one circuit card; and
   wherein the cells of the matrix of the at least one circuit card comprise capacitors.

10. The system of claim 9, wherein polarities of charges stored on the capacitors define which cells allow passage of the liquid metal and which cells block or restrict passage of the liquid metal.

11. The system of claim 10, wherein the cells that block or restrict passage of the liquid metal are configured to increase a viscosity of the liquid metal.

12. The system of claim 9, wherein the at least one pump comprises at least one electromagnetic pump.

13. The system of claim 9, further comprising:
    at least one controller configured to adjust the matrix of the at least one circuit card to define the at least one flow path for the liquid metal.

14. The system of claim 13, wherein the at least one controller is configured to adjust the matrix of the at least one circuit card to define different flow paths or different combinations of flow paths for the liquid metal, the different flow paths or different combinations of flow paths configured to allow transport of the liquid metal to different areas of the substrate of the at least one circuit card.

15. The system of claim 9, wherein the at least one circuit card further comprises:
    at least one flow path that is fixed and not reconfigurable.

16. The system of claim 15, wherein:
    the substrate of the at least one circuit card comprises at least one edge rail; and
    the at least one fixed flow path travels along the at least one edge rail.

17. A method comprising:
    configuring a matrix comprising multiple cells embedded within a substrate to generate electrostatic fields in order to define at least one flow path through the substrate;
    pumping liquid metal through the at least one flow path defined by the matrix; and
    removing thermal energy from one or more areas of the substrate using the liquid metal;
    wherein the cells of the matrix comprise capacitors.

18. The method of claim 17, further comprising:
    reconfiguring the matrix in order to define at least one second flow path through the substrate; and
    pumping the liquid metal through the at least one second flow path.

19. The method of claim 17, wherein:
    polarities of charges stored on the capacitors define which cells allow passage of the liquid metal and which cells block or restrict passage of the liquid metal; and
    the cells that block or restrict passage of the liquid metal are configured to increase a viscosity of the liquid metal.

20. The method of claim 17, wherein the substrate further comprises at least one flow path that is fixed and not reconfigurable.

\* \* \* \* \*